(12) United States Patent
Wu et al.

(10) Patent No.: US 12,733,503 B2
(45) Date of Patent: Sep. 8, 2026

(54) SEMICONDUCTOR DEVICE PACKAGE AND METHOD FOR MANUFACTURING THE SAME

(71) Applicant: Advanced Semiconductor Engineering, Inc., Kaohsiung (TW)

(72) Inventors: Zheng Wei Wu, Kaohsiung (TW); Cheng Kai Chang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 696 days.

(21) Appl. No.: 18/082,478

(22) Filed: Dec. 15, 2022

(65) Prior Publication Data

US 2024/0203897 A1 Jun. 20, 2024

(51) Int. Cl.
*H10W 42/20* (2026.01)
*H10W 74/10* (2026.01)
*H10W 95/00* (2026.01)

(52) U.S. Cl.
CPC .......... *H10W 42/20* (2026.01); *H10W 74/114* (2026.01); *H10W 95/00* (2026.01)

(58) Field of Classification Search
CPC .. H01L 23/552; H01L 23/3121; H10W 42/20; H10W 74/114; H01Q 21/30
See application file for complete search history.

(56) References Cited

U.S. PATENT DOCUMENTS 9,848,496 B2 12/2017 Nakao
2016/0254236 A1* 9/2016 Kim ........................ H01L 24/17 257/659
2018/0033737 A1* 2/2018 Kuhlman ................ H01L 23/60
2018/0130758 A1* 5/2018 Chiang ................... H01L 23/66
2021/0398921 A1* 12/2021 Chen ...................... H10W 44/20
2022/0157739 A1* 5/2022 Lee ........................ H01L 21/561
2023/0016061 A1* 1/2023 Lee ........................ H10W 42/20
2023/0074430 A1* 3/2023 Lee ................... H01L 23/49811
2023/0225049 A1* 7/2023 Oie ...................... H05K 3/3442 174/256
2023/0411305 A1* 12/2023 Park .................... H01L 25/0655

* cited by examiner

*Primary Examiner* — Erik Kielin
(74) *Attorney, Agent, or Firm* — Foley and Lardner LLP

(57) ABSTRACT

The present disclosure provides a semiconductor device package. The semiconductor device package includes a substrate having a first surface, an electrical contact disposed over a first region of the substrate, and an EMI shielding layer disposed over the substrate. The EMI shielding layer includes a non-uniform thickness and an elevation of the EMI shielding layer is higher than an elevation of the electrical contact with respect to the first surface of the substrate. A method for manufacturing a semiconductor device package is also disclosed.

20 Claims, 16 Drawing Sheets

SEMICONDUCTOR DEVICE PACKAGE AND METHOD FOR MANUFACTURING THE SAME

BACKGROUND

1. Technical Field

The present disclosure generally relates to a semiconductor device package and a method for manufacturing a semiconductor device package.

2. Description of the Related Art

In some existing techniques for forming an electromagnetic interference (EMI) shielding layer on an antenna package (such as Antenna in Package (AiP)), a mask (e.g., a jig) or a tape (e.g., a thermally stable tape) may be utilized to protect the conductive pads. The mask or the tape may cover the conductive pads and prevent them from being overlapped or covered by the EMI shielding layer.

As technology progresses, using a mask is unfavorable for miniaturization of the antenna package since the dimensions of the mask are not compatible with the keep out zone around the conductive pads. As for using the tape to cover the conductive pads, the tape may float over the conductive pads or spill on the edges. After the tape is removed, the EMI shielding layer may split from the antenna package, forming metal burrs on the edges. The metal burrs may cause particle contamination and may also cause short-circuits.

SUMMARY

In some arrangements, a semiconductor device package includes a substrate having a first surface, an electrical contact disposed over a first region of the substrate, and an EMI shielding layer disposed over the substrate. The EMI shielding layer includes a non-uniform thickness and an elevation of the EMI shielding layer is higher than an elevation of the electrical contact with respect to the first surface of the substrate.

In some arrangements, a semiconductor device package includes a substrate having a first surface, a grounding element exposed from the first surface of the substrate, and an EMI shielding layer disposed over the first surface of the substrate. At least a part of the EMI shielding layer comprises a non-uniform thickness and in contact with the grounding element.

In some arrangements, a method for manufacturing a semiconductor device package includes providing a mask structure to cover at least a portion of a predetermined shielding region of a substrate and forming an EMI shielding layer between the mask structure and the at least portion of the predetermined shielding region of the substrate.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

FIG. 2A-2, FIG. 2B-2, FIG. 2D-2, FIG. 2E-2, and FIG. 2F-2 illustrate cross-sectional views during one or more stages of a method for manufacturing a semiconductor device package in accordance with some arrangements of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
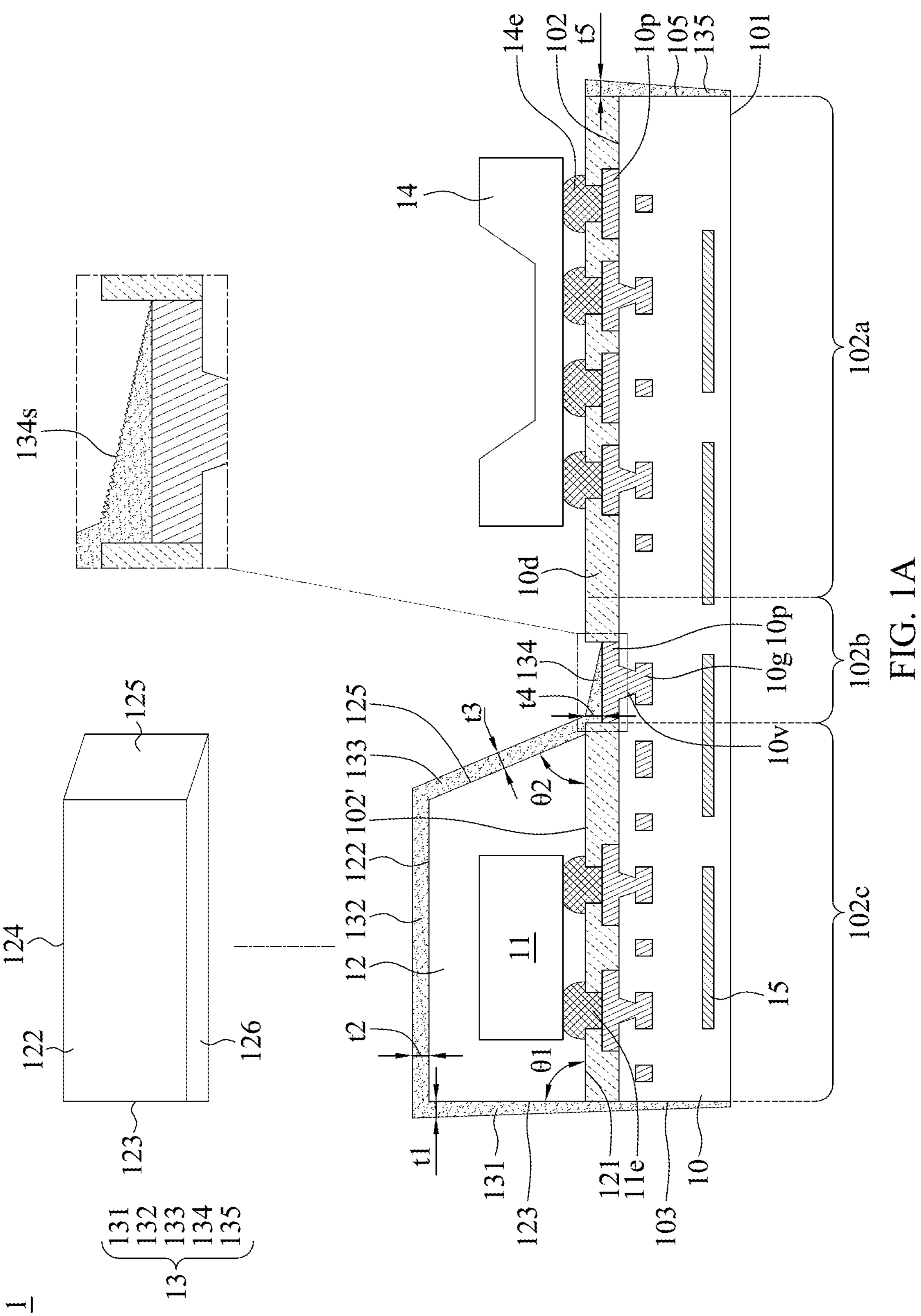
FIG. 1A illustrates a cross-sectional view of a semiconductor device package, in accordance with an arrangement of the present disclosure.

The following disclosure provides for many different arrangements, or examples, for implementing different features of the provided subject matter. Specific examples of components and arrangements are described below. These are, of course, merely examples and are not intended to be limiting. In the present disclosure, a reference to the formation of a first feature over or on a second feature in the description that follows may include arrangements in which the first and second features are formed in direct contact, and may also include arrangements in which additional features may be formed between the first and second features, such that the first and second features may not be in direct contact. In addition, the present disclosure may repeat reference numerals and/or letters in the various examples. This repetition is for simplicity and clarity and does not in itself dictate a relationship between the various arrangements and/or configurations discussed.

Arrangements of the present disclosure are discussed in detail below. It should be appreciated, however, that the present disclosure provides many applicable concepts that can be embodied in a wide variety of specific contexts. The specific arrangements discussed are merely illustrative and do not limit the scope of the disclosure.

Figure 1B:
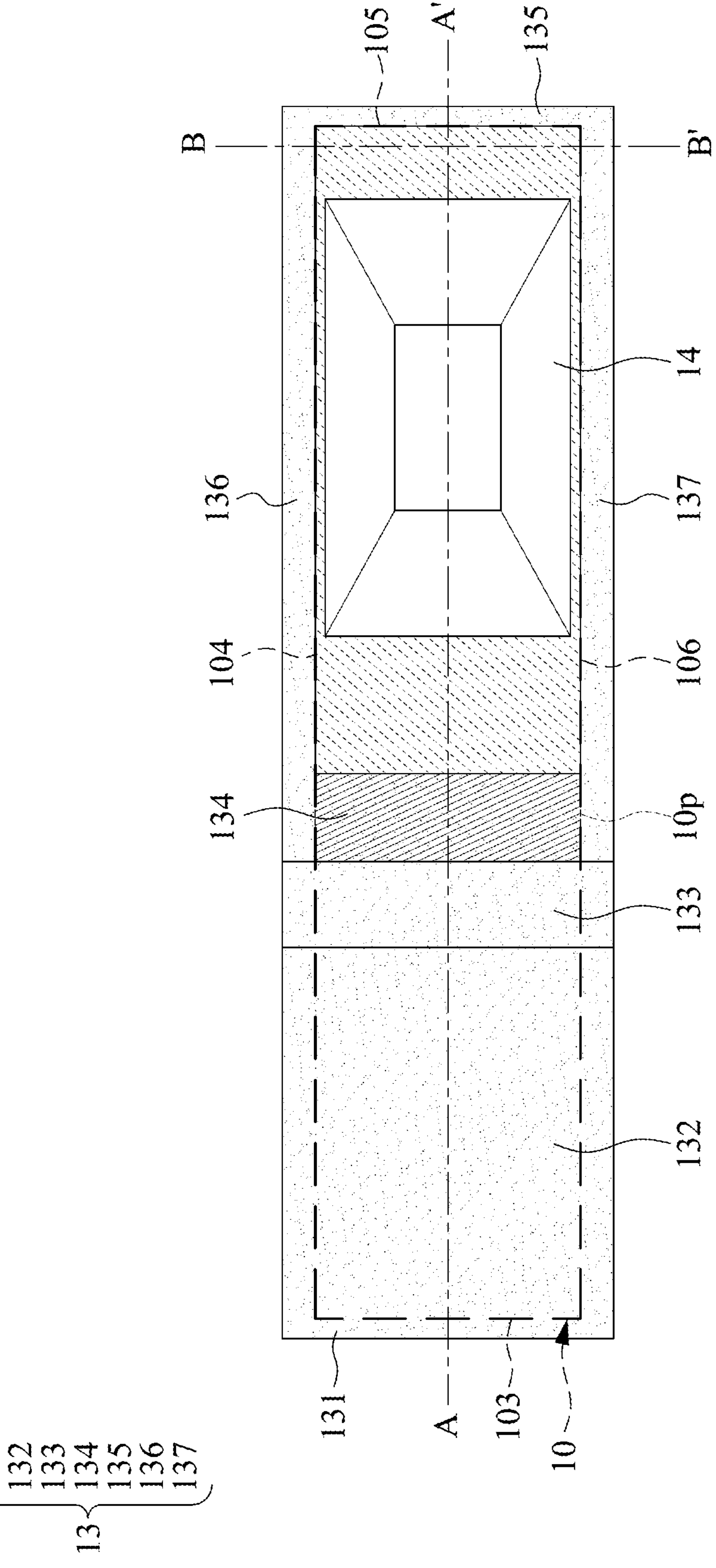
FIG. 1B illustrates a top view of a semiconductor device package, in accordance with an arrangement of the present disclosure.

FIG. 1A illustrates a cross-sectional view of a semiconductor device package 1, in accordance with an arrangement of the present disclosure. FIG. 1B illustrates a top view of the semiconductor device package 1. In some arrangements, the cross-sectional view in FIG. 1A is a cross-section through the line AA' in the top view in FIG. 1B.

The semiconductor device package 1 may include a carrier 10, an electronic component 11, an encapsulant 12, an electromagnetic interference (EMI) shielding layer 13, a connector 14, and antennas 15.

The semiconductor device package 1 may be or include an electronic package, such as an antenna device or an antenna package. In some arrangements, the semiconductor device package 1 may be or include a wireless device, such as a user equipment (UE), a mobile station, a mobile device, an apparatus communicating with the Internet of Things (IOT), etc.

The carrier 10 (or a supporting element) may be or include a substrate, such as an organic substrate or a coreless substrate. In some arrangements, the carrier 10 may include a two-layer substrate which includes a core layer and a conductive material and/or structure disposed on an upper surface and a bottom surface of the carrier 10. The conductive material and/or structure may include a plurality of traces. In some arrangements, the carrier 10 may include a redistribution layer (RDL). A line spacing and/or a pad pitch in the carrier 10 may be about 2 μm/2 μm or lower.

In some arrangements, the carrier 10 may be or include a printed circuit board, such as a paper-based copper foil laminate, a composite copper foil laminate, or a polymer-impregnated glass-fiber-based copper foil laminate. The carrier 10 may have a surface 101, a surface 102 opposite to the surface 101, and multiple surfaces (or lateral surfaces) 103, 104, 105, 106 extending between the surface 101 and the surface 102. The surfaces 103 and 105 are opposite to each other. The surfaces 104 and 106 are indicated in FIG. 1B and are opposite to each other.

In some arrangements, the carrier 10 may include conductive layer(s), pad(s), trace(s), via(s), or other interconnection(s). For example, the carrier 10 may include a build-up circuit. For example, the carrier 10 may include one or more conductive layers and one or more dielectric layers. The conductive layers may include routing traces to route, signal, power, ground, clock, or the like. For example, the conductive layers may include one or more antenna elements, one or more transmission lines (e.g., communications cables), and one or more grounding lines and/or grounding planes.

For example, the carrier 10 may include one or more conductive pads 10*p* in proximity to, adjacent to, or embedded in and exposed at the surface 102 of the carrier 10. A dielectric layer 10*d* disposed over or on the surface 102 may expose at least a portion of the conductive pads 10*p* for electrical connections. The dielectric layer 10*d* may include a surface 102' (or a top surface) facing away from the carrier 10. In some arrangements, the carrier 10 may include a grounding line 10*g*. The grounding line 10*g* may be disposed in the dielectric layers of the carrier 10. The grounding line 10*g* may be surrounded or covered by the dielectric layers of the carrier 10.

At least one of the conductive pads 10*p* may be electrically connected to the grounding line 10*g* through a conductive via 10*v*. In some arrangements, the at least one of the conductive pads 10*p*, the conductive via 10*v*, and the grounding line 10*g* may be collectively referred to as a grounding structure.

In some arrangements, the conductive pads 10*p*, the conductive via 10*v*, and the grounding line 10*g* may include a conductive material such as a metal or metal alloy. Examples of the conductive material include gold (Au), silver (Ag), copper (Cu), platinum (Pt), Palladium (Pd), other metal(s) or alloy(s), or a combination of two or more thereof. In some arrangements, the dielectric layers of the carrier 10 may include pre-impregnated composite fibers (e.g., pre-preg), Borophosphosilicate Glass (BPSG), silicon oxide, silicon nitride, silicon oxynitride, undoped silicate glass (USG), any combination thereof, or the like. Examples of a pre-preg may include, but are not limited to, a multi-layer structure formed by stacking or laminating a number of pre-impregnated materials/sheets. In some arrangements, the dielectric layer 10*d* disposed over or on the surface 102 of the carrier 10 may include a solder mask or a solder resist.

The carrier 10 may include regions 102*a*, 102*b*, and 102*c*. In some arrangements, the regions 102*a*, 102*b*, and 102*c* may be different or distinct regions on the surface 102 of the carrier 10. It is noted that the regions 102*a*, 102*b*, and 102*c* may not have visible or observable boundaries. The region 102*a* may abut or be connected with the region 102*b*, and the region 102*b* may abut or be connected with the region 102*c*. In other arrangements, the region 102*a* may be laterally spaced apart from the region 102*b* by a gap or a distance, and the region 102*b* may be laterally spaced apart from the region 102*c* by a gap or a distance. The regions 102*a*, 102*b*, and 102*c* of the carrier 10 may include or encompass surface regions of the surface 102 or imaginary sections of the carrier 10. The region 102*a* may include a predetermined non-shield region and the region 102*b* may include a shielding region.

The antennas 15 may be disposed in the carrier 10. The antennas 15 may be configured to radiate and/or receive electromagnetic signals, such as radio frequency (RF) signals. The antennas 15 may be of any suitable type, such as patch antennas, slot-coupled antenna, stacked patches, dipoles, monopoles, etc., and may have different orientations and/or polarizations. The antennas 15 may have different frequencies (or operating frequencies) or bandwidths (or operating bandwidths). The antennas 15 may each include a conductive material such as a metal or metal alloy. Examples of the conductive material include gold (Au), silver (Ag), copper (Cu), platinum (Pt), Palladium (Pd), other metal(s) or alloy(s), or a combination of two or more thereof.

The electronic component 11 may be disposed over or on the surface 102 of the carrier 10. The electronic component 11 may be disposed over or on the region 102*c* of the carrier 10. The electronic component 11 may be electrically connected to one or more other electrical components (if any) and to the carrier 10 (e.g., to the interconnection(s)), and the electrical connection may be attained by way of flip-chip, wire-bond techniques, metal to metal bonding (such as Cu to Cu bonding), or hybrid bonding. For example, electronic component 11 may be electrically connected to the carrier 10 through an electrical contact 11*e*. In some arrangements, the electrical contact 11*e* may include a controlled collapse chip connection (C4) bump, a ball grid array (BGA) or a land grid array (LGA).

In some arrangements, the electronic component 11 may be a chip or a die including a semiconductor substrate, one or more integrated circuit devices and one or more overlying interconnection structures therein. The integrated circuit devices may include active devices such as transistors and/or passive devices such as resistors, capacitors, inductors, or a combination thereof. In some arrangements, the electronic component 11 may be integrated circuit (IC) dies, radio frequency ICs (RFICs), power management ICs (PMICs), surface mount devices (SMDs), etc.

The encapsulant 12 may be disposed over or on the surface 102 of the carrier 10 to encapsulate the electronic component 11. In some arrangements, the encapsulant 12 may include a surface 121 facing the carrier 10, a surface 122 opposite to the surface 121, and multiple surfaces (or lateral surfaces) 123, 124, 125, 126 extending between the surface 121 and the surface 122. The surfaces 123 and 125 are opposite to each other. The surfaces 124 and 126 are indicated in FIG. 1B and are opposite to each other.

The surface 121 of the encapsulant 12 may contact the surface 102' of the dielectric layer 10*d*. The surface 123 of the encapsulant 12 may be substantially coplanar with the surface 103 of the carrier 10. The surface 124 of the encapsulant 12 may be substantially coplanar with the surface 104 of the carrier 10. The surface 126 of the encapsulant 12 may be substantially coplanar with the surface 106 of the carrier 10.

The surface 125 of the encapsulant 12 may face the connector 14. In some arrangements, a slope of the surface 123 of the encapsulant 12 and a slope of the surface 125 of the encapsulant 12 may be different. In some arrangements, the surface 123 of the encapsulant 12 may define an angle "θ1" with the surface 102 of the carrier 10, and the surface 125 of the encapsulant 12 may define an angle "θ2" with the surface 102 of the carrier 10 (or the surface 102' of the dielectric layer 10*d*). The angle θ1 and the angle θ2 may be different. For example, the angle θ1 may be greater than the angle θ2. For example, the angle θ1 may be substantially equal to about 90 degrees, and the angle θ2 may be substantially smaller than about 90 degrees.

In some arrangements, the encapsulant 12 may include an epoxy resin having fillers, a molding compound (e.g., an epoxy molding compound or other molding compound), a polyimide (PI), a phenolic compound or material, a material with a silicone dispersed therein, or a combination thereof.

The EMI shielding layer 13 may be configured to provide an EMI shielding protection for the electronic component 11. For example, the EMI shielding layer 13 may be configured to provide an EMI shielding to prevent the electronic component 11 from being interfered with by other electronic components, and vice versa.

In some arrangements, the EMI shielding layer 13 may include copper (Cu) or other conductive materials, such as aluminum (Al), chromium (Cr), tin (Sn), gold (Au), silver (Ag), nickel (Ni) or stainless steel, another metal, or a mixture, an alloy, or other combinations of two or more thereof. In some arrangements, the EMI shielding layer 13 may be or include a conductive layer or a conductive thin film. In some arrangements, the EMI shielding layer 13 may be or include a multi-layered structure. For example, layers of the EMI shielding layer 13 from the inside to the outside may include a seed layer (such as porous stainless steel, SUS), a conductive layer (such as Cu), and a protection layer (such as SUS).

The EMI shielding layer 13 may be disposed over or on one or more outer surfaces of the semiconductor device package 1. In some arrangements, the EMI shielding layer 13 may be in contact with one or more outer surfaces of the semiconductor device package 1. In some arrangements, the EMI shielding layer 13 may directly contact one or more outer surfaces of the semiconductor device package 1.

The EMI shielding layer 13 may include portions 131, 132, 133, 134, 135, 136, and 137. The portions 136 and 137 are indicated in FIG. 1B.

The portion 131 of the EMI shielding layer 13 may be disposed over or on the surface 123 of the encapsulant 12 and the surface 103 of the carrier 10. The portion 131 of the EMI shielding layer 13 may be continuously disposed over or on the surface 123 of the encapsulant 12 and the surface 103 of the carrier 10. The portion 131 of the EMI shielding layer 13 may cover or encapsulate the surface 123 of the encapsulant 12 and the surface 103 of the carrier 10.

In some arrangements, the portion 131 of the EMI shielding layer 13 may have a thickness "t1" measured along a direction substantially perpendicular to the surface 123 of the encapsulant 12 and the surface 103 of the carrier 10. The thickness t1 may gradually change. In some arrangements, the thickness t1 may not be constant.

In some arrangements, the portion 131 of the EMI shielding layer 13 may taper from the surface 122 of the encapsulant 12 toward the surface 101 of the carrier 10. For example, the thickness t1 of the portion 131 closer to the surface 101 of the carrier 10 may be substantially less than the thickness t1 of the portion 131 closer to the surface 122 of the encapsulant 12.

The portion 132 of the EMI shielding layer 13 may be disposed over or on the surface 122 of the encapsulant 12. The portion 132 of the EMI shielding layer 13 may cover or encapsulate the surface 122 of the encapsulant 12. The portion 132 of the EMI shielding layer 13 may be connected between the portion 131 and the portion 133 of the EMI shielding layer 13. The portion 132 of the EMI shielding layer 13 may be disposed higher than an electrical contact 14*e* with respect to the surface 102 of the carrier 10. An elevation of the EMI shielding layer 13 may be higher than an elevation of the electrical contact 14*e* with respect to the surface 102 of the carrier 10.

In some arrangements, the portion 132 of the EMI shielding layer 13 may have a thickness "t2" measured along a direction substantially perpendicular to the surface 122 of the encapsulant 12. In some arrangements, the thickness t2 may be constant. In some arrangements, the portion 132 of the EMI shielding layer 13 may be substantially planar. In some arrangements, the portion 132 of the EMI shielding layer 13 may have a consistent thickness.

The portion 133 of the EMI shielding layer 13 may be disposed over or on a sidewall (such as the surface 125) of the encapsulant 12. The portion 133 of the EMI shielding layer 13 may cover or encapsulate the surface 125 of the encapsulant 12. The portion 133 of the EMI shielding layer 13 may be connected between the portion 132 and the portion 134 of the EMI shielding layer 13.

In some arrangements, the portion 133 of the EMI shielding layer 13 may have a thickness "t3" measured along a direction substantially perpendicular to the surface 125 of the encapsulant 12. In some arrangements, the thickness t3 may be constant. In some arrangements, the portion 133 of the EMI shielding layer 13 may be substantially planar. In some arrangements, the portion 133 of the EMI shielding layer 13 may have a consistent thickness.

The portion 134 of the EMI shielding layer 13 may be disposed over or on the surface 102 of the carrier 10. The portion 134 of the EMI shielding layer 13 may cover or encapsulate the surface 102 of the carrier 10. The portion 134 of the EMI shielding layer 13 may extend between the surface 104 and the surface 106 of the carrier 10 as shown in FIG. 1B. The portion 132 of the EMI shielding layer 13 may be disposed higher than the portion 134 with respect to the surface 102 of the carrier 10. A bottom surface of the portion 134 of the EMI shielding layer 13 and a bottom surface of the portion 132 of the EMI shielding layer 13 may be substantially parallel.

In some arrangements, the portion 134 of the EMI shielding layer 13 may be electrically connected to the grounding structure of the carrier 10. For example, the portion 134 of the EMI shielding layer 13 may be electrically connected to the at least one of the conductive pads 10*p*, the conductive via 10*v*, and the grounding line 10*g*.

Figure 1C:
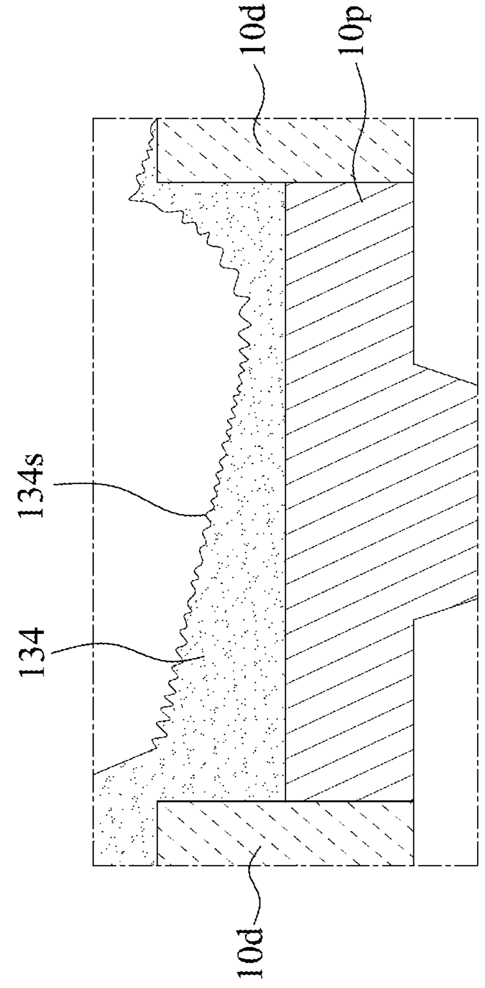
FIG. 1C illustrates an enlarged view of a part of a semiconductor device package, in accordance with an arrangement of the present disclosure.
Figure 1C:
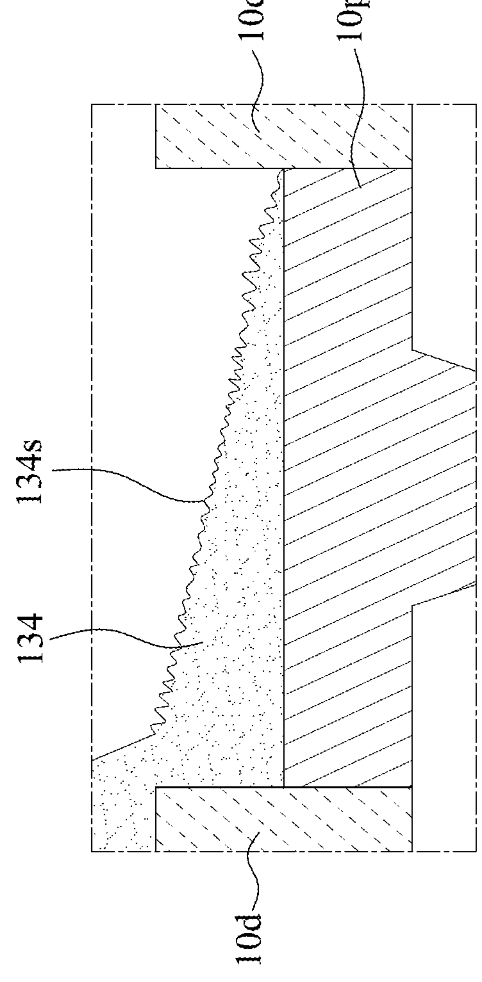

In some arrangements, the portion 134 of the EMI shielding layer 13 may be disposed over or on the at least one of the conductive pads 10*p*, as illustrated in FIG. 1A. However, the present disclosure is not limited thereto. For example, in some other arrangements, the portion 134 of the EMI shielding layer 13 may be disposed over or on the dielectric layer 10*d*. For example, in some other arrangements, the portion 134 of the EMI shielding layer 13 may be disposed over or on both of the at least one of the conductive pads 10*p* and the dielectric layer 10*d*, as shown in FIG. 1C.

In some arrangements, the portion 134 of the EMI shielding layer 13 may have a thickness "t4" measured along a direction substantially perpendicular to the surface 102 of the carrier 10. The portion 134 of the EMI shielding layer 13 may have a non-uniform thickness. The thickness t4 may gradually change. In some arrangements, the thickness t4 may not be constant. In some arrangements, the thickness t3 of the portion 133 may be greater than the thickness t4 of the portion 134.

In some arrangements, the portion 134 of the EMI shielding layer 13 may taper from the surface 125 of the encapsulant 12 toward the connector 14. For example, the thickness t4 of the portion 134 closer to the connector 14 may be substantially less than the thickness t4 of the portion 134 closer to the surface 125 of the encapsulant 12.

The portion 135 of the EMI shielding layer 13 may be disposed over or on the surface 105 of the carrier 10. The portion 135 of the EMI shielding layer 13 may cover or encapsulate the surface 105 of the carrier 10. In some arrangements, the portion 135 of the EMI shielding layer 13 may also cover or encapsulate the surface 102 of the carrier 10. For example, the portion 135 of the EMI shielding layer 13 may also be disposed over or on the region 102*a* of the carrier 10.

In some arrangements, the portion 135 of the EMI shielding layer 13 may have a thickness "t5" measured along a direction substantially perpendicular to the surface 105 of the carrier 10. The thickness t5 may gradually change. In some arrangements, the thickness t5 may not be constant.

In some arrangements, the portion 135 of the EMI shielding layer 13 may taper from the surface 102 of the carrier 10 toward the surface 101 of the carrier 10. For example, the thickness t5 of the portion 135 closer to the surface 101 of the carrier 10 may be substantially less than the thickness t5 of the portion 135 closer to the surface 102 of the carrier 10.

Figures 1, 2A:
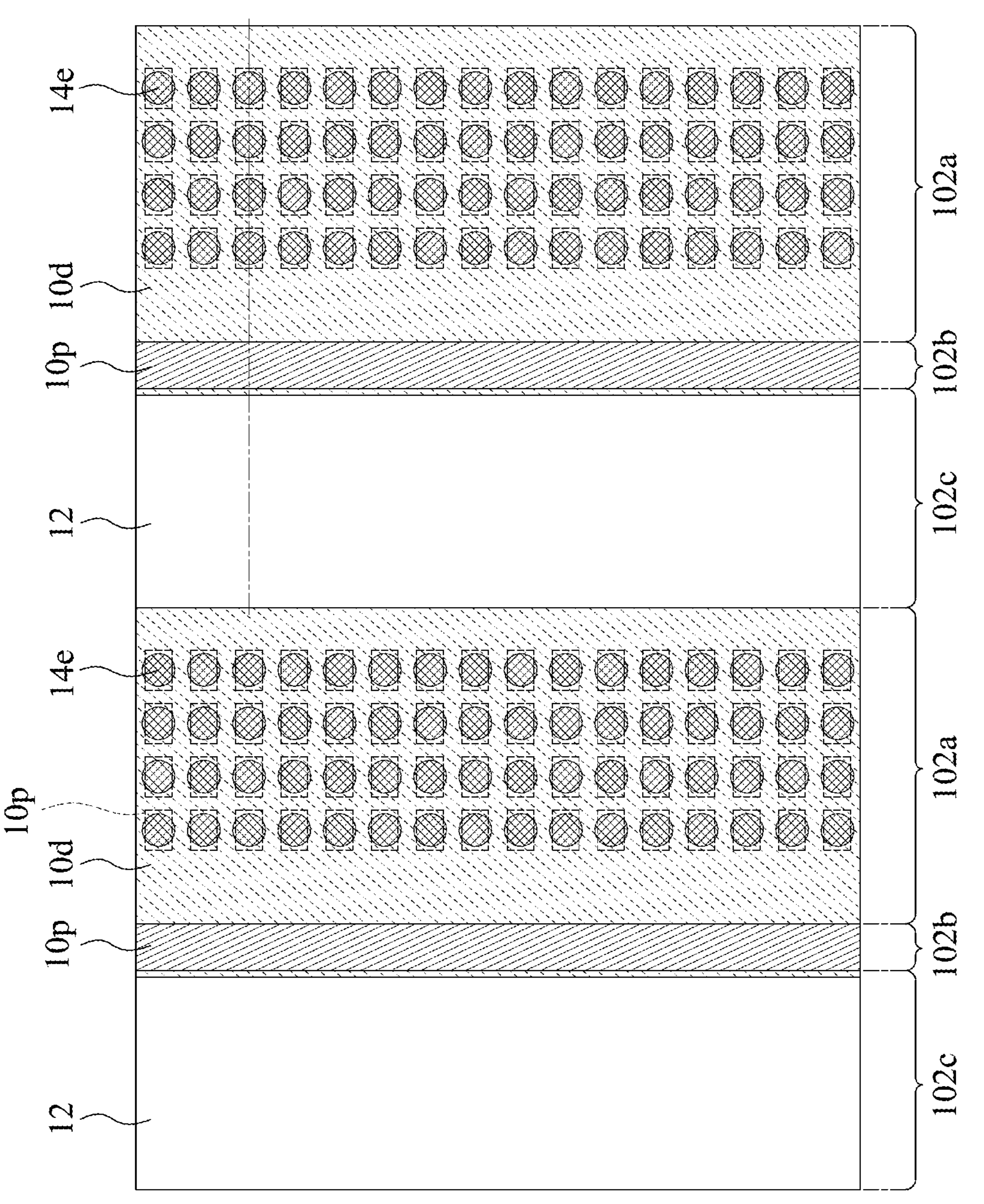
FIG. 2A-1, FIG. 2B-1, FIG. 2C, FIG. 2D-1, FIG. 2E-1, and FIG. 2F-1 illustrate top views during one or more stages of a method for manufacturing a semiconductor device package in accordance with some arrangements of the present disclosure.
Figures 2, 2A:
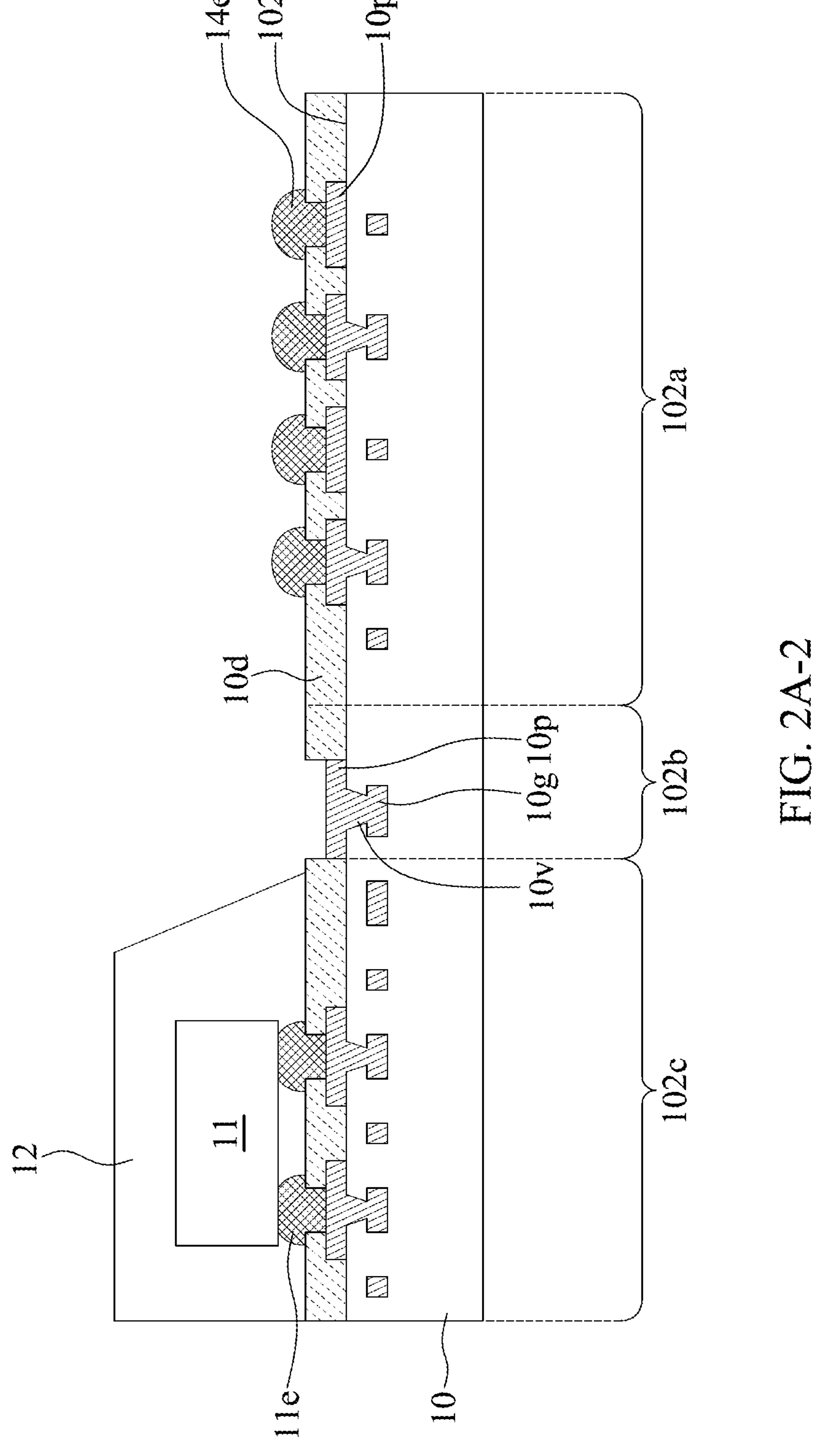
Figures 1, 2B:
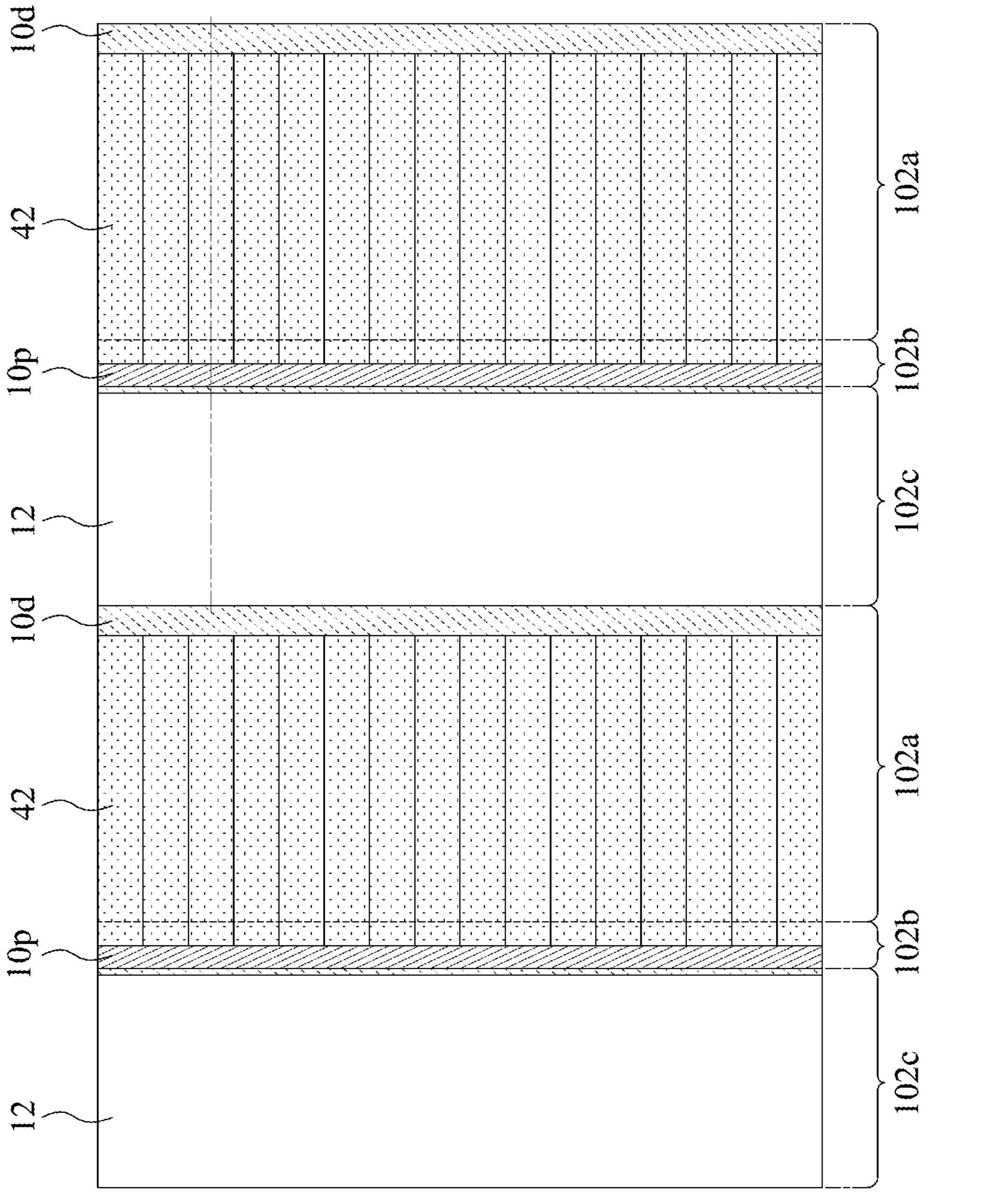
Figures 2, 2B:
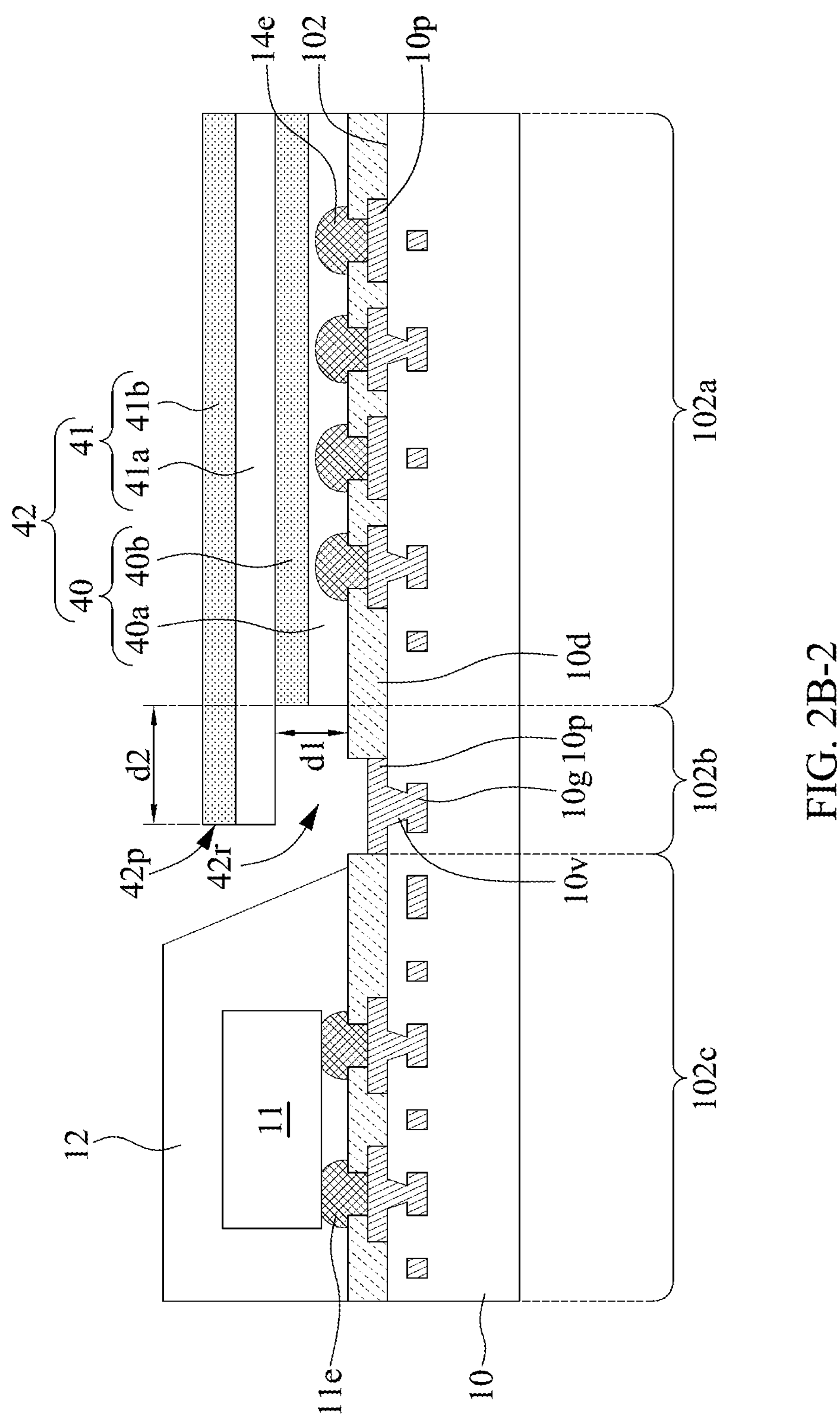

The portion 136 of the EMI shielding layer 13 indicated in FIG. 2B may be disposed over or on the surface 104 of the carrier 10. The portion 136 of the EMI shielding layer 13 may cover or encapsulate the surface 104 of the carrier 10. The portion 136 of the EMI shielding layer 13 may be connected between the portion 131 and the portion 135 of the EMI shielding layer 13. In some arrangements, the portion 136 of the EMI shielding layer 13 may also cover or encapsulate the surface 102 of the carrier 10. For example, the portion 136 of the EMI shielding layer 13 may also be disposed over or on the region 102*a* of the carrier 10.

The portion 137 of the EMI shielding layer 13 may be disposed over or on the surface 106 of the carrier 10. The portion 137 of the EMI shielding layer 13 may cover or encapsulate the surface 106 of the carrier 10. The portion 137 of the EMI shielding layer 13 may be connected between the portion 131 and the portion 135 of the EMI shielding layer 13. In some arrangements, the portion 137 of the EMI shielding layer 13 may also cover or encapsulate the surface 102 of the carrier 10. For example, the portion 137 of the EMI shielding layer 13 may also be disposed over or on the region 102*a* of the carrier 10.

Similar to the portion 135 of the EMI shielding layer 13, the portions 136 and 137 of the EMI shielding layer 13 may both taper from the surface 102 of the carrier 10 toward the surface 101 of the carrier 10.

In some arrangements, the thickness t1 of the portion 131 may be between about 5 micrometers (μm) and about 2 μm. The thickness t2 of the portion 132 may be about 7 μm. The thickness t3 of the portion 133 may be about 7 μm. The thickness t4 of the portion 134 may be between about 4 μm and 3 μm. The thickness t5 of the portion 135 may be between about 5 μm and 2 μm. The thickness t6 of the portion 136 may be between about 5 μm and 2 μm. The thickness t7 of the portion 137 may be between about 5 μm and 2 μm. However, the present disclosure is not limited thereto. The dimensions (such as the areas, the thicknesses, the lengths, etc.) of the EMI shielding layer 13 may be adjusted based on design requirements.

In some arrangements, a surface roughness (such as Ra and/or Rz) of the portion 133 of the EMI shielding layer 13 may be different from a surface roughness of one of the portions 131, 132, 134, 135, 136, and 137 of the EMI shielding layer 13. For example, a surface roughness of the portion 133 of the EMI shielding layer 13 may be substantially greater than a surface roughness of one of the portions 131, 132, 134, 135, 136, and 137 of the EMI shielding layer 13.

During a manufacturing process of the semiconductor device package 1 according to some arrangements of the present disclosure, as shown in FIG. 2B-2, a region 102*b* of the carrier 10 is covered, blocked, sheltered, or protected by an overhanging portion 42*p* of a protection structure (or a mask structure) 42. The protection structure 42 covers at least a portion of a predetermined shielding region (such as the region 102*b*).

The amount of the conductive material of the EMI shielding layer 13 being disposed over the region 102*b* of the carrier 10 may be restricted or limited by the overhanging portion 42*p* of the protection structure 42, thus forming a tapering structure like the portion 134 of the EMI shielding layer 13. In addition, an uneven, irregular, or rough surface of the overhanging portion 42*p* of the protection structure 42 may cause an uneven formation of the conductive material and lead to a rough surface 134*s* of the portion 134 of the EMI shielding layer 13.

The connector 14 may be disposed over or on the surface 102 of the carrier 10 and spaced apart from the electronic component 11. The connector 14 may be separated from the electronic component 11 by the portion 134 of the EMI shielding layer 13. The connector 14 may be disposed over or on the region 102*a* of the carrier 10. The connector 14 may be electrically connected to the carrier 10 (e.g., to the interconnection(s)) and the electronic component 11, and the electrical connection may be attained by way of flip-chip, wire-bond techniques, metal to metal bonding (such as Cu to Cu bonding), or hybrid bonding. For example, connector 14 may be electrically connected to the conductive pad 10*p* of the carrier 10 through an electrical contact 14*e*. In some arrangements, the electrical contact 14*e* may include a controlled collapse chip connection (C4) bump, a ball grid array (BGA) or a land grid array (LGA). In some arrangements, the portion 132 of the EMI shielding layer 13 may be disposed higher than the electrical contact 14*e* with respect to the surface 102 of the carrier 10. In some arrangements, the top end of the portion 134 of the EMI shielding layer 13 may be lower than the top end of the electrical contact 14*e* with respect to the surface 102 of the carrier 10.

In some arrangements, the connector 14 may be configured to provide electrical connections between the semiconductor device package 1 and external components (e.g., external circuits or circuit boards). The connector 14 may be exposed from the EMI shielding layer 13. For example, from a top view perspective, the connector 14 may not be overlapped with the EMI shielding layer 13. The connector 14 may be surrounded by the portions 134, 135, 136, and 137 of the EMI shielding layer 13. In some arrangements, the connector 14 may include a board-to-board connector or a connector for HotBar soldering.

In some existing techniques for forming the EMI shielding layer 13 on one or more outer surfaces of the semiconductor device package 1, a mask (e.g., a jig) or a tape (e.g., a thermally stable tape) may be utilized to protect the conductive pads 10*p* and the electrical contact 14*e*.

The dimension of the mask cannot be compatible with the keep out zone (between about 95 μm and about 195 μm, such as about 145 μm) around the conductive pads 10*p*. As for using the tape, if the tape is too thin, it may float over the conductive pads 10*p* and the electrical contact 14*e* and may not fully cover the conductive pads 10*p* and the electrical contact 14*e* through, for example, sputtering operations or spray coating operations. On the other hand, if the tape is too thick, it may spill on the edges due to surface wetting or an external force applied from, for example, a roll laminator. After the tape is removed, the EMI shielding layer 13 may split from the surface 102, forming metal burrs on the edges. The metal burrs may cause particle contamination and may also cause short-circuits.

Figure 2C:
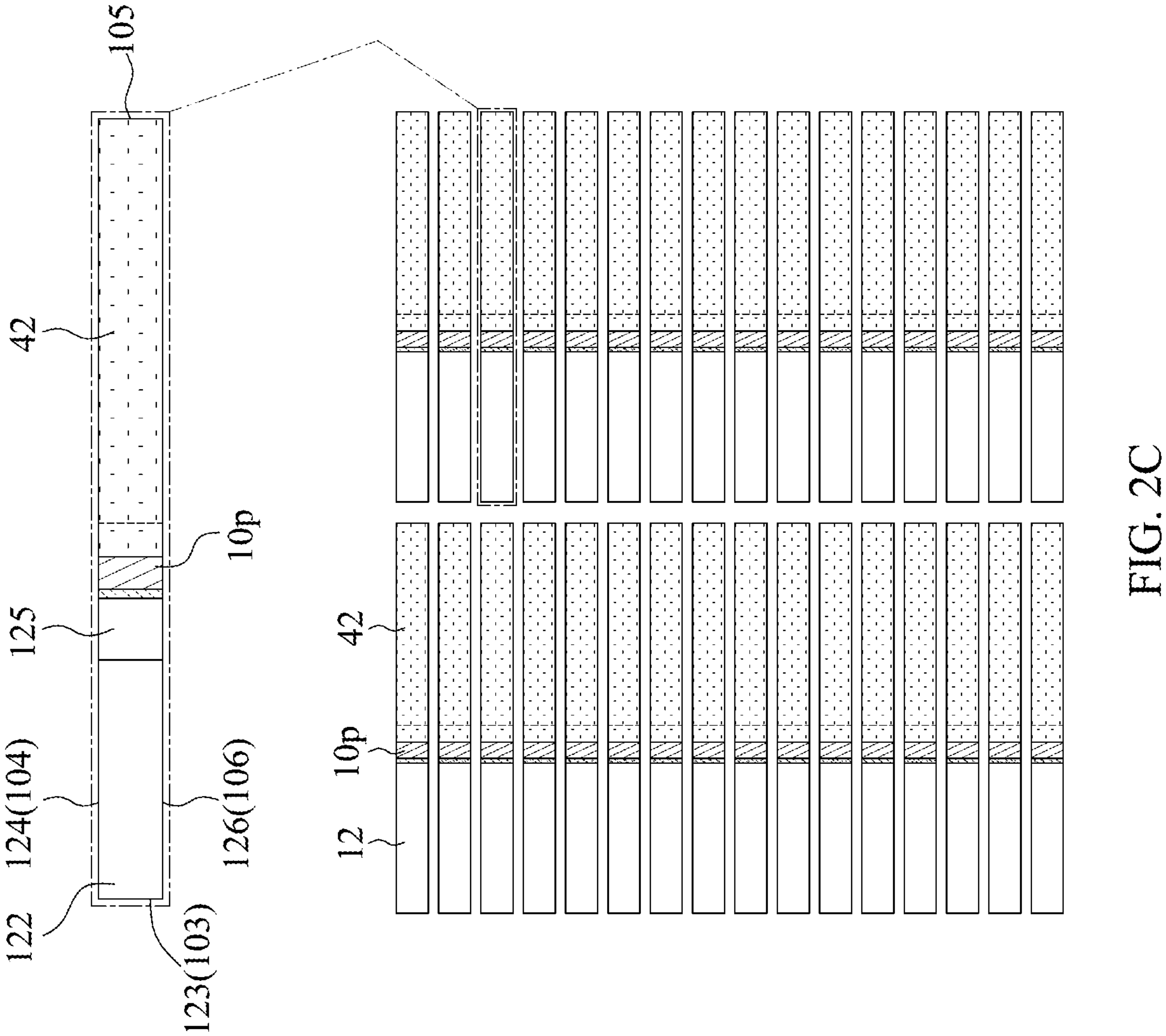
Figures 1, 2D:
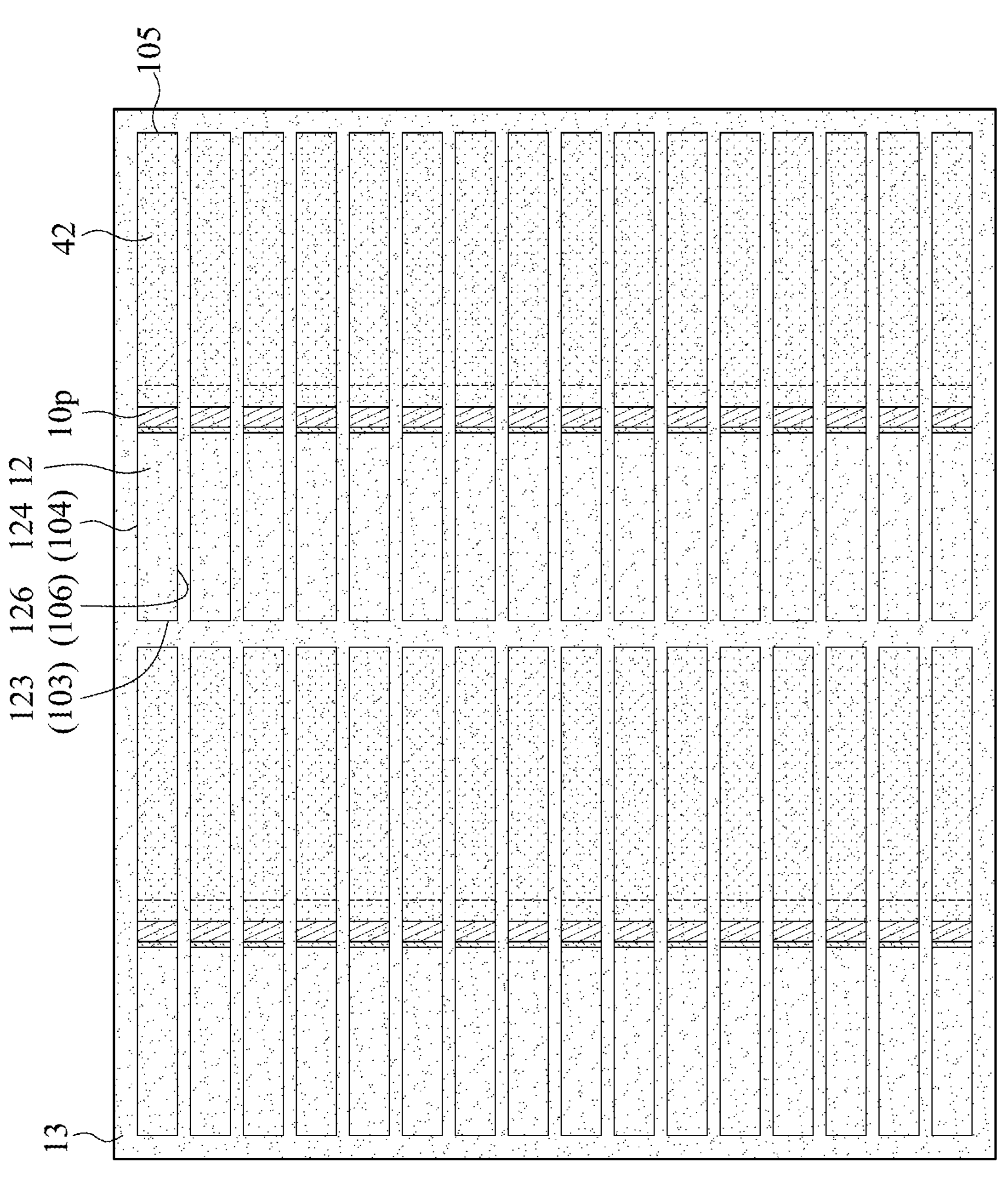
Figures 2, 2D:
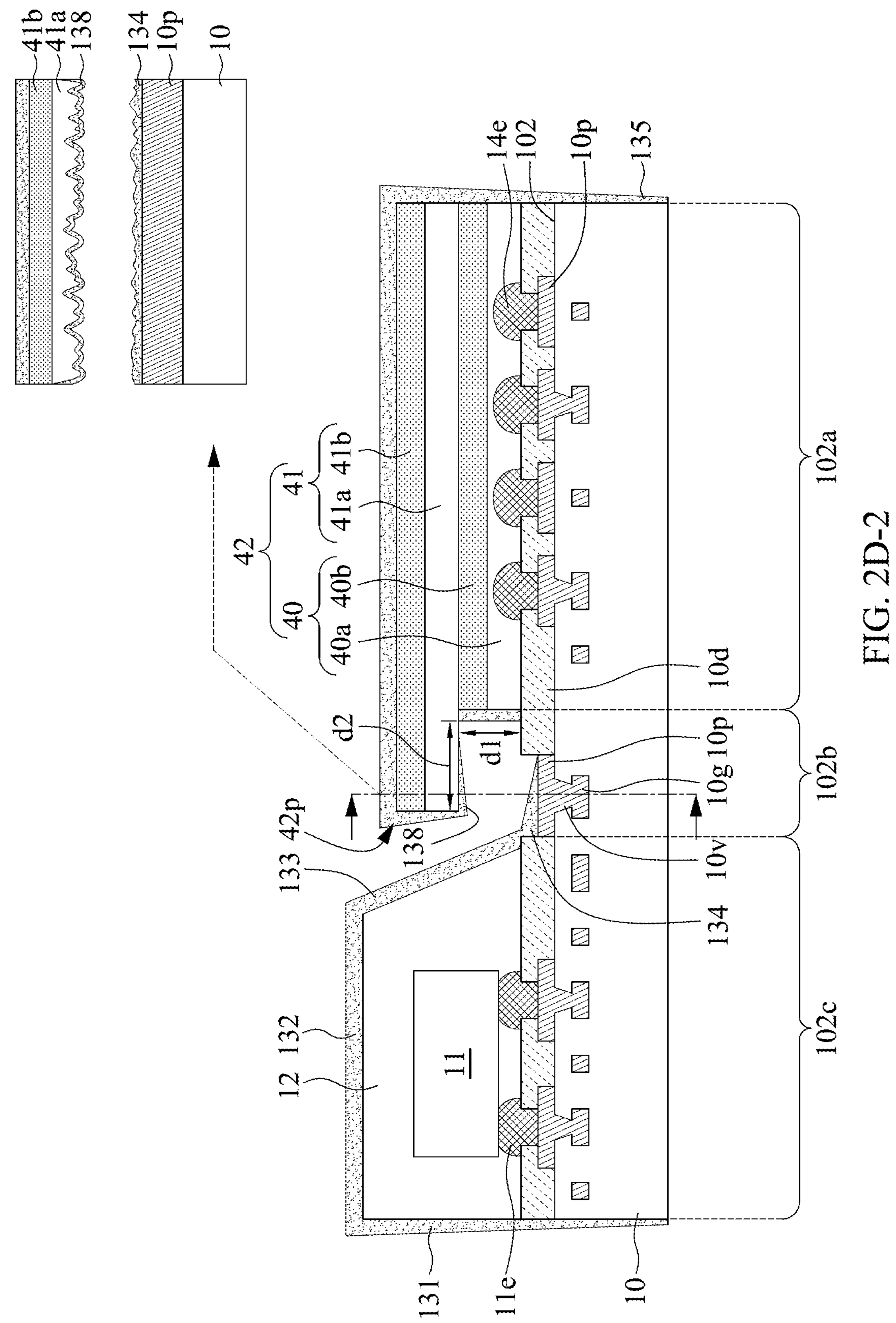

By comparison, in the present disclosure, as shown in FIG. 2D-2, the overhanging portion 42*p* of the protection structure 42 is used to cover, block, shelter, or protect the region 102*b* of the carrier 10 during sputtering operations or spray coating operations for forming the EMI shielding layer 13.

Figures 1, 2E:
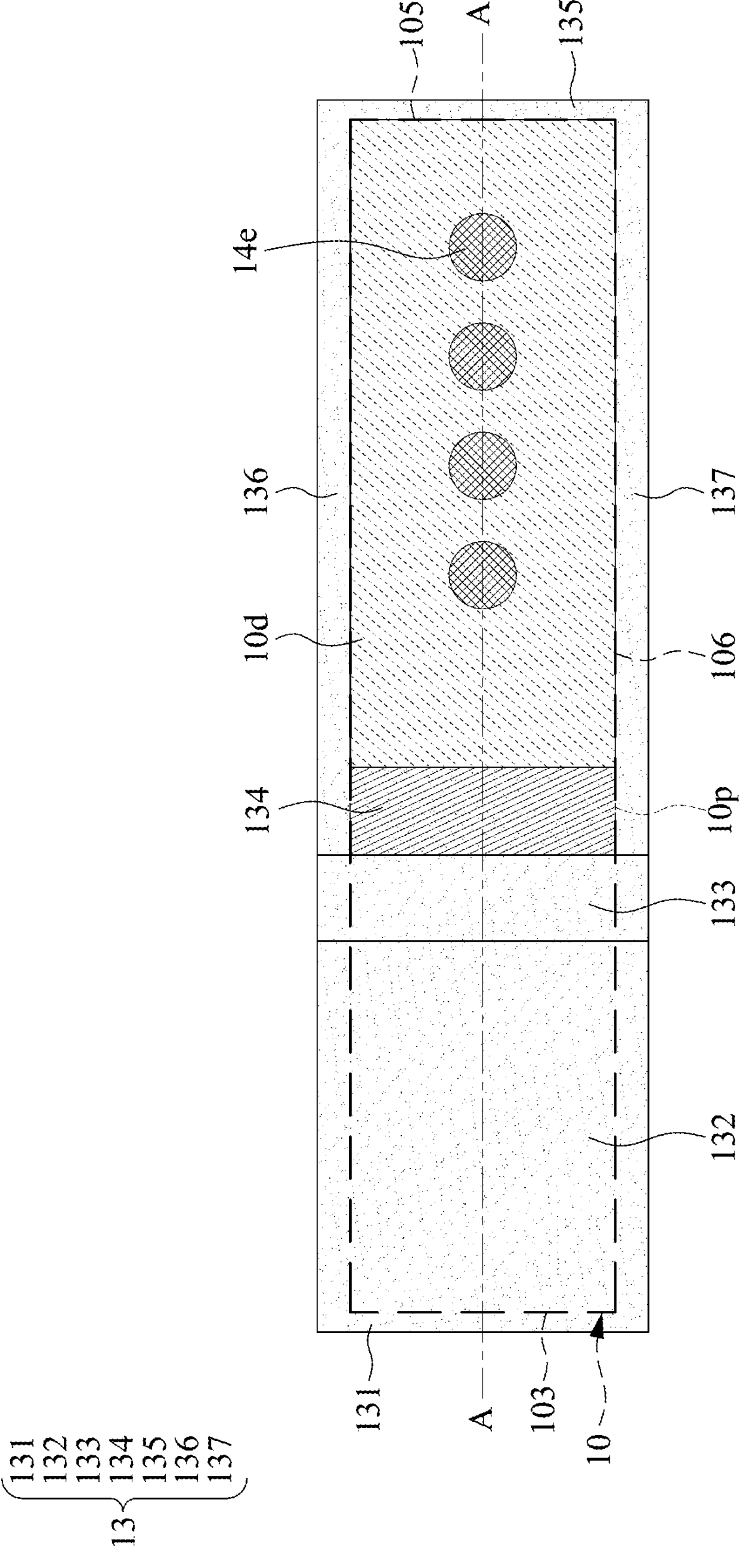
Figures 2, 2E:
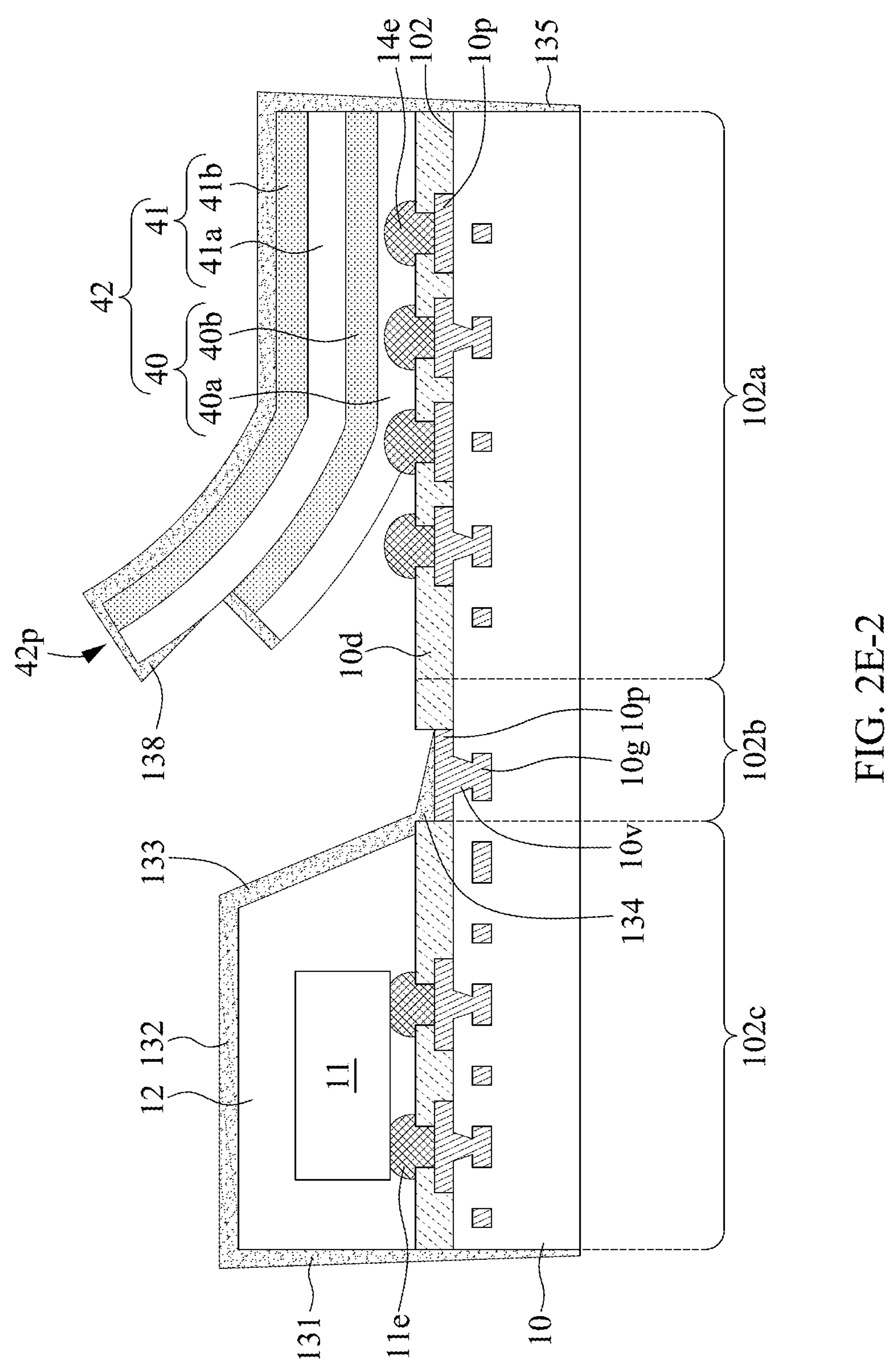

As shown in FIG. 2E-2, since the amount of the conductive material of the EMI shielding layer 13 being disposed between the region 102*b* of the carrier 10 and the overhanging portion 42*p* of the protection structure 42 is restricted or limited by the overhanging portion 42*p*, the EMI shielding layer 13 is not connected or continuous between the carrier 10 and the protection structure 42. The EMI shielding layer 13 will stick to the carrier 10 and not break on the edges of the protection structure 42 after the protection structure 42 is removed. Therefore, the metal burr formation can be prevented.

In addition, since the formation of the portion 134 of the EMI shielding layer 13 is affected by the overhanging portion 42*p* of the protection structure 42, the portion 134 may taper from the surface 125 of the encapsulant 12 toward the connector 14. The portion 134 of the EMI shielding layer 13 may have the rough surface 134*s*, which is rougher than other portions (such as the portions 131, 132, 133, 135, 136, and 137) of the EMI shielding layer 13.

The rough surface 134*s* of the portion 134 of the EMI shielding layer 13 may be configured to collect or conduct the electromagnetic waves transmitted from or toward an antenna element (such as the one or more antenna elements in the carrier 10) of the semiconductor device package 1. In some arrangements, the EMI shielding layer 13 may be configured to reflect a portion of the electromagnetic waves transmitted by the one or more antenna elements. Therefore, the radiation directivity and the antenna gain thereof may be increased.

FIG. 1C illustrates an enlarged view of a part of a semiconductor device package, in accordance with an arrangement of the present disclosure. The enlarged view of FIG. 1C may be a part of the semiconductor device package 1 in FIG. 1A.

The carrier 10 may include an opening and the conductive pad 10*p* may be disposed in the opening. The dielectric layer 10*d* may constitute the sidewalls of the opening. The portion 134 of the EMI shielding layer 13 may be disposed over or on both the conductive pad 10*p* and the dielectric layer 10*d*. The portion 134 of the EMI shielding layer 13 may be grounded through the conductive pad 10*p*. The portion 134 of the EMI shielding layer 13 may connect a grounding structure (which may include at least one of the conductive pads 10*p*, the conductive via 10*v*, and the grounding line 10*g* in FIG. 1A) through the opening. The portion 134 of the EMI shielding layer 13 may cover an edge of the dielectric layer 10*d*. The portion 134 of the EMI shielding layer 13 may be disposed along an outline or a contour of the edge of the dielectric layer 10*d*. The portion 134 of the EMI shielding layer 13 may have a recess recessed toward the conductive pads 10*p*. The end point of the portion 134 of the EMI shielding layer 13 may stick to the region 102*b* of the carrier 10 and not break on the edges of protection structure 42 (as shown in FIG. 2B-2). Therefore, the metal burr formation can be prevented. In some arrangements, the closer the rough surface 134*s* to the region 102*a* (i.e., the predetermined non-shield region shown in FIG. 1A) is rougher. For example, a portion of the EMI shielding layer 13 closer to the predetermined non-shield region is thinner than another portion of the EMI shielding layer 13 farther from the predetermined non-shield region. For example, the EMI shielding layer 13 tapers toward the predetermined non-shield region.

FIG. 1C' illustrates an enlarged view of a part of a semiconductor device package, in accordance with an arrangement of the present disclosure. The enlarged view of FIG. 1C may be a part of the semiconductor device package 1 in FIG. 1A.

In some arrangements, the closer the rough surface 134*s* to the electrical contact 14*e* shown in FIG. 1A is rougher.

In some arrangements, a portion of the EMI shielding layer 13 closer to the electrical contact 14*e* is thinner than another portion of the EMI shielding layer 13 farther from the electrical contact 14*e*. For example, the EMI shielding layer 13 tapers toward the electrical contact 14*e*.

Figure 1D:
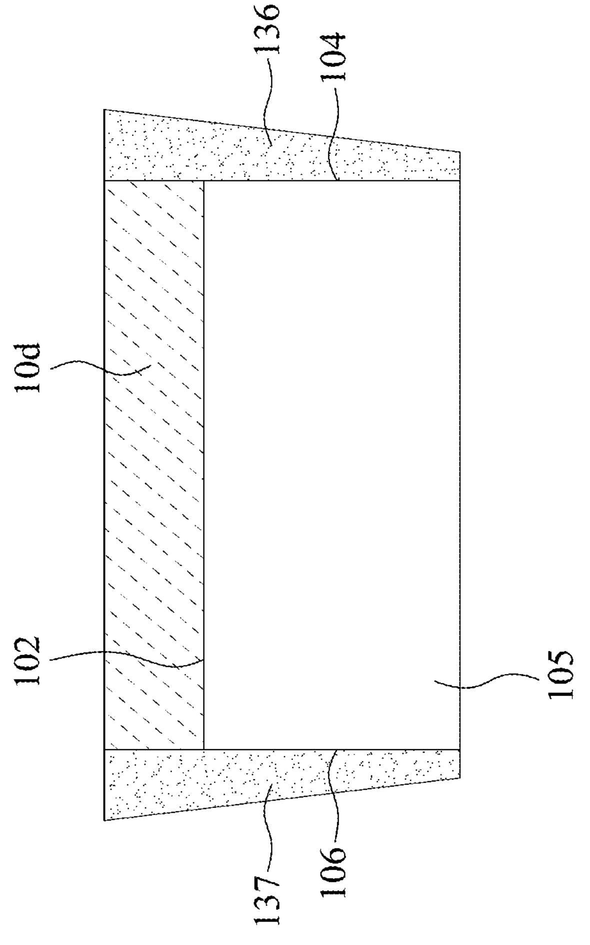
FIG. 1D illustrates a cross-sectional view of a part of a semiconductor device package, in accordance with an arrangement of the present disclosure.

FIG. 1D illustrates a cross-sectional view of a part of a semiconductor device package, in accordance with an arrangement of the present disclosure. In some arrangements, the cross-sectional view in FIG. 1D is a cross-section through the line BB' in the top view in FIG. 1B.

The portion 136 of the EMI shielding layer 13 may be disposed over or on the surface 104 of the carrier 10. The portion 137 of the EMI shielding layer 13 may be disposed over or on the surface 106 of the carrier 10.

FIG. 2A-1, FIG. 2B-1, FIG. 2C, FIG. 2D-1, FIG. 2E-1, and FIG. 2F-1 illustrate top views during one or more stages of a method for manufacturing a semiconductor device package in accordance with some arrangements of the present disclosure. FIG. 2A-2, FIG. 2B-2, FIG. 2D-2, FIG. 2E-2, and FIG. 2F-2 illustrate cross-sectional views of the top views in FIG. 2A-1, FIG. 2B-1, FIG. 2D-1, FIG. 2E-1, and FIG. 2F-1, respectively.

At least some of these figures have been simplified to better understand the aspects of the present disclosure. In some arrangements, the semiconductor device package 1 may be manufactured through the operations described with respect to FIG. 2A-1 through FIG. 2F-1 and FIG. 2A-2 through FIG. 2F-2.

Referring to FIG. 2A-1 and FIG. 2A-2, the carrier 10 is provided. In some arrangements, the carrier 10 may include a copper clad laminate (CCL) substrate that includes several carrier units, wherein one may be separable from another by a scribe line (not shown). Since each of the carrier units is subjected to similar or identical processes in the manufacturing method, for convenience, only one exemplary carrier unit is illustrated in the cross-sectional views.

One or more conductive pads 10*p* may be exposed from the region 102*a* of the surface 102 of the carrier 10. The electrical contacts 14*e* may be disposed over or on the regions 102*a* of the surface 102 of the carrier 10. A part of a grounding structure (which may include at least one of the conductive pads 10*p*, the conductive via 10*v*, and the grounding line 10*g*) may be exposed from the region 102*b* of the carrier 10. The electronic component 11 and the encapsulant 12 may be disposed over or on the region 102*c* of the surface 102 of the carrier 10.

Referring to FIG. 2B-1 and FIG. 2B-2, the protection structure (or the mask structure) 42 may be disposed over or on the region (or the predetermined non-shield region) 102*a* and the region (or the shielding region) 102*b* of the surface 102 of the carrier 10. The protection structure 42 may cover or encapsulate the electrical contacts 14*e* over the region 102*a* of the carrier 10. The protection structure 42 may include the overhanging portion 42*p* over the region 102*b* of the carrier 10.

As shown in the top view of FIG. 2B-1, the conductive pads 10*p* of the grounding structure may be partially covered by the protection structure 42. However, in some other arrangements, the conductive pads 10*p* of the grounding structure may be entirely covered by the protection structure 42.

As shown in the cross-sectional view of FIG. 2B-2, the protection structure 42 may define a space exposing the region 102*b* of the carrier 10. The protection structure 42 may cover the region 102*b* of the carrier 10. The region 102*b* of the carrier 10 may not be in contact with the protection structure 42. For example, the protection structure 42 may define a recessed portion or a space 42*r*. The overhanging portion 42*p* may protrude with respect to the recessed portion 42*r*. The region 102*b* of the carrier 10 may be exposed from the recessed portion 42*r*. The overhanging portion 42*p* may be spaced apart from the region 102*b* of the carrier 10. The overhanging portion 42*p* may be physically separated from the region 102*b* of the carrier 10.

In some arrangements, the recessed portion 42*r* may have a first dimension (such as a thickness or a height) d1 and a second dimension (such as a width or a depth) d2. The second dimension may be substantially perpendicular to the first dimension. In some arrangements, the ratio of the first dimension to the second dimension may in the range of 1:1 to 1:2.

In some arrangements, the protection structure 42 may include protection layers (or mask layers) 40 and 41. The protection layer 40 may cover the region 102*a* of the carrier 10 and the protection layer 41 may cover the region 102*b* of the carrier 10. In some arrangements, the protection layers 40 and 41 may each be or include, for example, a thermally stable tape. In some arrangements, the protection layers 40 and 41 may collectively define a step over the region 102*b* of the carrier 10.

In some arrangements, the protection layer 40 may include a curable layer 40*a* and a base film 40*b*. The sidewalls of the curable layer 40*a* and the base film 40*b* may be substantially coplanar. The protection layer 41 may include a curable layer 41*a* and a base film 41*b*. The sidewalls of the curable layer 41*a* and the base film 41*b* may be substantially coplanar.

The curable layers 40*a* and 41*a* may include a thermosetting material or light-activated resin, such as an ultraviolet (UV) curable polymer or epoxy resin having a photo initiator (such as a UV photo initiator or a visible light photo initiator). Other cross-linked polymeric resins may be used. Examples may include phenolic formaldehyde (PF) resins, phenolic neoprene, resorcinol formaldehydes (RF), polyesters, polyimides (PI), etc. The curable layer 41*a* may be disposed between the base film 40*b* and the base film 41*b*. The curable layer 41*a* may be partially covered by the base film 40*b*. The curable layer 41*a* may be partially exposed from the base film 40*b*. The part of the curable layer 41*a* exposed from the base film 40*b* may face the region 102*b* of the carrier 10. In some arrangements, the thickness of each of the curable layers 40*a* and 41*a* may be from about 20 μm to about 75 μm. The base films 40*b* and 41*b* may be carriers for carrying the curable layers 40*a* and 41*a*. In some arrangements, the thickness of each of the base films 40*b* and 41*b* may be about 50 μm.

However, the present disclosure is not limited thereto. For example, in some other arrangements, the protection layer 41 may be omitted and the protection structure 42 may include one protection layer 40. The sidewalls of the curable layer 40*a* and the base film 40*b* may not be coplanar. The base film 40*b* may protrude from the curable layer 40*a* and form an overhanging portion over the region 102*b* of the carrier 10.

Referring to FIG. 2C, the carrier 10, the encapsulant 12, and the protection structure 42 are singulated or diced into a plurality of individual carrier units in a singulation operation. In some arrangements, the singulation operation may be applied using a saw blade or laser cutting tool. The singulation operation may include cutting or sawing four sides of the carrier units. For example, after the singulation operation, the carrier 10 may include multiple surfaces (or lateral surfaces) 103, 104, 105, and 106. For example, after the singulation operation, the encapsulant 12 may include multiple surfaces (or lateral surfaces) 123, 124, 125, and 126. The surface 125 of the encapsulant 12 may not be cut or sawed and thus the slope and the angle thereof may be different from the slope and the angle of the surface 123, as indicated in FIG. 1A.

In some arrangements, the singulation operation may be subsequent to a curing operation to cure the curable layers 40*a* and 41*a* and to increase the viscosity or adhesiveness of the curable layers 40*a* and 41*a*. Examples of the curing operation may include a thermal curing operation or a photo curing operation (e.g., a UV curing operation).

In some arrangements, after the singulation operation, one or more of the carrier units may be attached to a temporary carrier (not illustrated in the figures). The carrier units carried by the temporary carrier may undergo the following operations together.

Referring to FIG. 2D-1 and FIG. 2D-2, a conductive material may be formed on the carrier 10, the encapsulant 12, and the protection structure 42, forming the EMI shielding layer 13.

The conductive pads 10*p* and the electrical contact 14*e* may be covered or protected from the conductive material by the protection structure 42. The conductive material may be disposed over or on the protection structure 42, forming a portion 138 of the EMI shielding layer 13 on the protection structure 42.

The portion 134 of the EMI shielding layer 13 may be disposed between the protection structure 42 and the carrier 10. The portion 134 of the EMI shielding layer 13 may have a non-uniform thickness. The portion 134 of the EMI shielding layer 13 may be disposed over or on the region 102*b* of the carrier 10. Since the overhanging portion 42*p* of the protection structure 42 restricts or limits the amount of the conductive material disposed in the recessed portion 42*r* (or disposed between the region 102*b* of the carrier 10 and the overhanging portion 42*p* of the protection structure 42), the portion 134 is not connected or continuous with the portion 138 of the EMI shielding layer 13 on the protection structure 42. For example, the portion 134 is disconnected from the portion 138. For example, the portion 134 is not in contact with the portion 138.

In some arrangements, the portion 138 of the EMI shielding layer 13 may be disposed along the outline or contour of the protection structure 42. For example, the portion 138 may be disposed over or on a top surface of the base film 41*b*, a sidewall of the base film 41*b*, a sidewall of the curable layer 41*a*, a part of the curable layer 41*a* facing the region 102*b* of the carrier 10, a sidewall of the base film 40*b*, and/or a sidewall of the curable layer 40*a*. However, the present disclosure is not limited thereto. For example, in some other arrangements, the portion 138 may not be disposed over or on the sidewall of the base film 40*b* and the sidewall of the curable layer 40*a*.

In some arrangements, the overhanging portion 42*p* of the protection structure 42 may have an uneven, irregular, or rough surface. The different distances to the region 102*b* of the carrier 10 may cause an uneven formation of the conductive material and lead to the rough surface 134*s* of the portion 134 of the EMI shielding layer 13.

In some arrangements, the EMI shielding layer 13 may be disposed through, for example, a physical vapor deposition (PVD), such as sputter deposition or spray coating. In some arrangements, the EMI shielding layer 13 may be disposed through a chemical vapor deposition (CVD) or plating.

Referring to FIG. 2E-1 and FIG. 2E-2, the protection structure 42 may be removed from the carrier 10. In some arrangements, before the removing operation, a curing operation may be performed to cure the curable layers 40*a* and 41*a* to facilitate the removing operation. In some arrangements, the curing operation may include a thermal curing operation or a photo curing operation (e.g., a UV curing operation). In some arrangements, the viscosity or adhesiveness of the curable layers 40*a* and 41*a* may be decreased after the curing operation to facilitate the removing operation.

In some arrangements, since the portion 134 of the EMI shielding layer 13 is not connected or continuous with a portion 138 of the EMI shielding layer 13 on the protection structure 42, the portion 134 of the EMI shielding layer 13 will stick to the region 102*b* of the carrier 10 and not break on the edges of protection structure 42. Therefore, the metal burr formation can be prevented.

Figures 1, 2F:
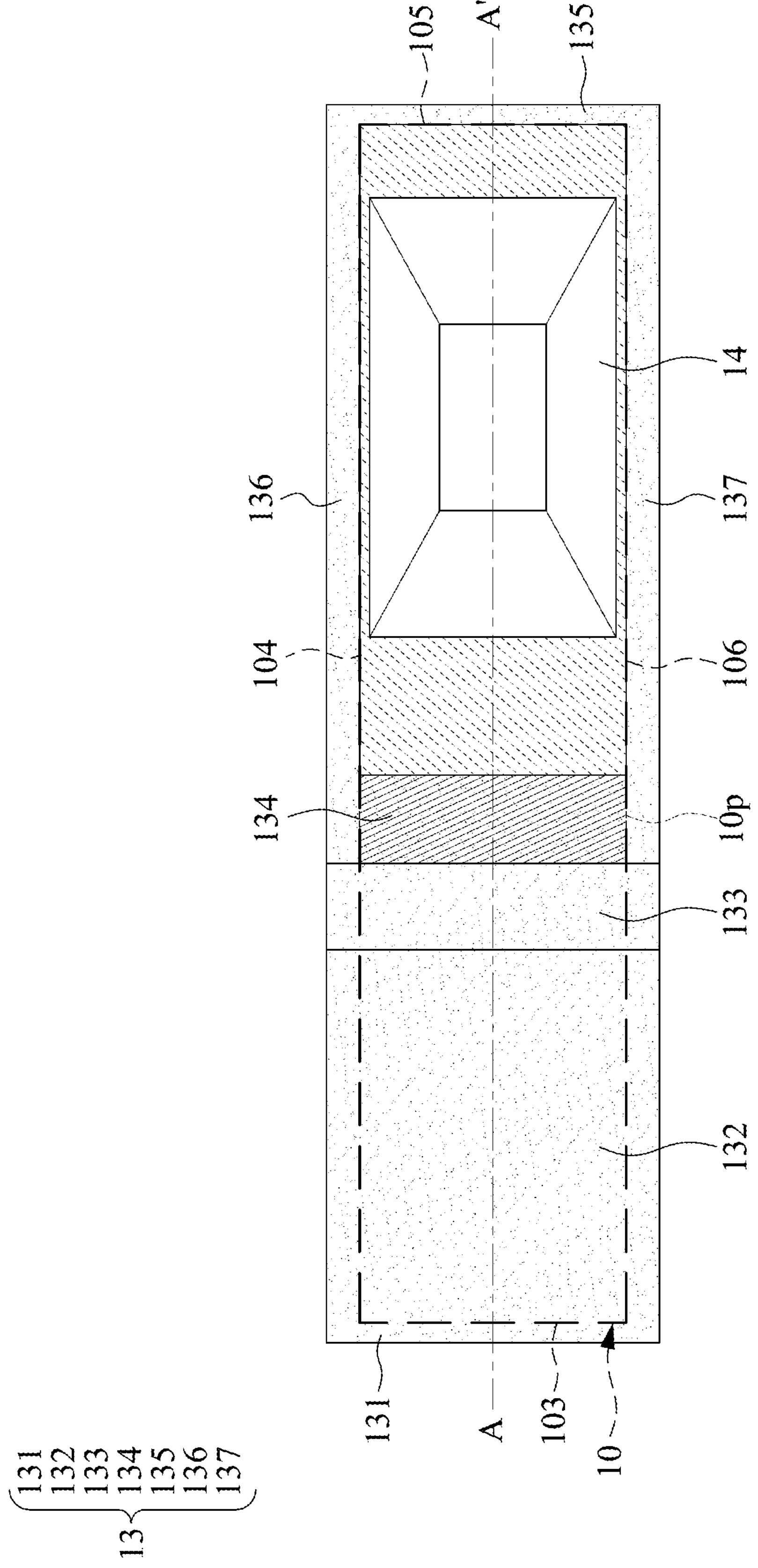
Figures 2, 2F:
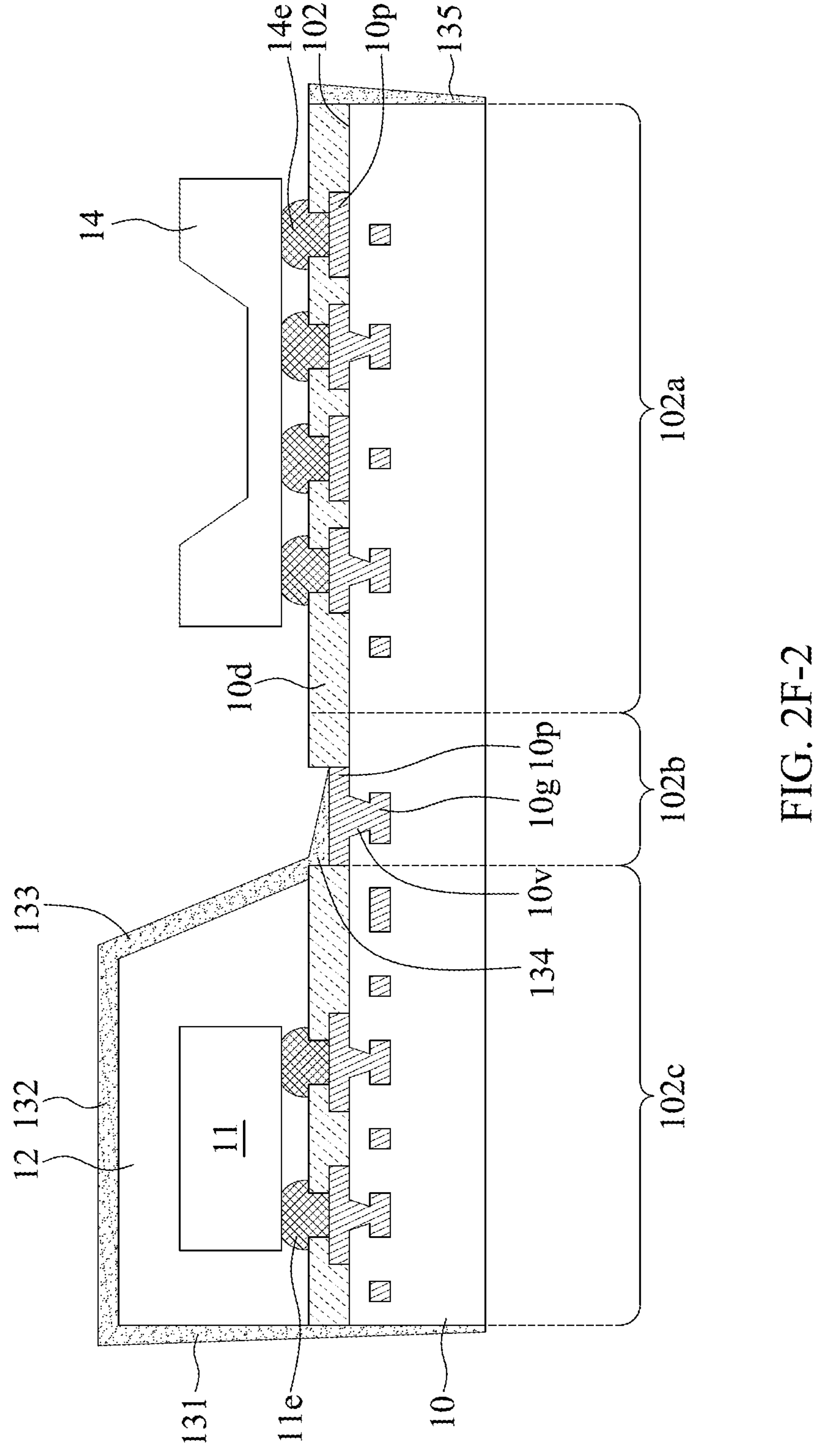

Referring to FIG. 2F-1 and FIG. 2F-2, the connector 14 may be disposed over or on the region 102*a* of the carrier 10. The connector 14 may be electrically connected to the conductive pad 10*p* of the carrier 10 through the electrical contact 14*e*. In some arrangements, a surface treatment may be performed to the surface 102 to reflow or melt the electrical contact 14*e*. The surface treatment may include, for example, a plasma treatment, a heat treatment, a laser treatment, a combination thereof, or another suitable treatment. The final structure may be similar to the semiconductor device package 1 in FIG. 1.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several arrangements and detailed aspects of the present disclosure. The arrangements described in the present disclosure may be readily used as a basis for designing or modifying other processes and structures for carrying out the same or similar purposes and/or achieving the same or similar advantages of the arrangements introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:

a substrate having a first surface;

a plurality of antennas embedded in the substrate, wherein the plurality of antennas have different operating frequencies;

a dielectric layer disposed over the first surface of the substrate and defining an opening, wherein a conductive pad is exposed from the opening and overlapped with one of the plurality of antennas in a direction substantially perpendicular to the first surface of the substrate; and an EMI shielding layer disposed over the first surface of the substrate, wherein the EMI shielding layer contacts both the conductive pad and the dielectric layer, and wherein the EMI shielding layer is disposed along a contour of an edge of the dielectric layer.

2. The semiconductor device package of claim 1, wherein the EMI shielding layer has a recess recessed toward the conductive pad.

3. The semiconductor device package of claim 1, wherein an end point of the EMI shielding layer sticks to the dielectric layer and the opening is entirely covered by the EMI shielding layer.

4. The semiconductor device package of claim 1, wherein the plurality of antennas are overlapped with the EMI shielding layer in a direction substantially parallel with the first surface of the substrate.

5. The semiconductor device package of claim 1, further comprising:

an electronic component disposed over the first surface of the substrate; and an encapsulant covering the electronic component, wherein the EMI shielding layer is disposed over the encapsulant.

6. The semiconductor device package of claim 5, wherein the encapsulant has a slope surface defining an angle smaller than about 90 degrees with the first surface of the substrate.

7. The semiconductor device package of claim 6, wherein the encapsulant has a top surface facing away from the substrate, and a surface roughness of a first portion of the EMI shielding layer on the slope surface of the encapsulant is greater than a surface roughness of a second portion of the EMI shielding layer on the top surface of the encapsulant.

8. The semiconductor device package of claim 7, wherein the substrate has a second surface opposite to the first surface, and the EMI shielding layer extends from the top surface of the encapsulant to the second surface of the substrate.

9. The semiconductor device package of claim 1, further comprising:

a plurality of electrical contacts disposed over the first surface of the substrate.

10. The semiconductor device package of claim 9, further comprising:

a connector disposed over the plurality of electrical contacts and uncovered by the EMI shielding layer.

11. The semiconductor device package of claim 10, wherein the EMI shielding layer comprises a third portion disposed over a sidewall of the substrate and having a top surface substantially coplanar with the dielectric layer.

12. The semiconductor device package of claim 1, wherein the EMI shielding layer has a first portion tapering toward the edge of the dielectric layer, a second portion tapering from a top surface of the conductive pad toward a top surface of the dielectric layer, and a third portion tapering away from the edge of the dielectric layer, and wherein the first portion of the EMI shielding layer has a roughness greater than that of other portions of the EMI shielding layer and is configured to conduct electromagnetic waves transmitted to or from the plurality of antennas.

13. A semiconductor device package, comprising:

a substrate having a first surface;

a dielectric layer disposed over the first surface of the substrate and defining an opening;

a grounding structure exposed from the opening; and an EMI shielding layer disposed over the first surface of the substrate, wherein at least a portion of the EMI shielding layer comprises a non-uniform thickness and in contact with the grounding structure, wherein the EMI shielding layer is disposed along a contour of an edge of the dielectric layer, and wherein the portion of the EMI shielding layer has a roughness greater than that of other portions of the EMI shielding layer and has a tapering profile, and wherein the portion of the EMI shielding layer is configured to conduct electromagnetic waves transmitted to or from an antenna element.

14. The semiconductor device package of claim 13, wherein the grounding structure includes a conductive pad, a grounding line, and a conductive via connecting between the conductive pad and the grounding line.

15. The semiconductor device package of claim 13, wherein the EMI shielding layer comprises a recess recessed toward the grounding structure, an end point of the EMI shielding layer sticks to the dielectric layer, and wherein the opening is entirely covered by the EMI shielding layer.

16. The semiconductor device package of claim 13, wherein the portion of the EMI shielding layer is configured to reflect a portion of the electromagnetic waves transmitted to or from the antenna element.

17. The semiconductor device package of claim 13, wherein the portion of the EMI shielding layer is configured to increase a radiation directivity and an antenna gain of the antenna element.

18. A semiconductor device package, comprising:

a substrate having a first surface;

a dielectric layer disposed over the first surface of the substrate and defining an opening, wherein a conductive pad is exposed from the opening; and an EMI shielding layer disposed over the first surface of the substrate, wherein the EMI shielding layer contacts both the conductive pad and the dielectric layer, and wherein the EMI shielding layer is disposed along a contour of an edge of the dielectric layer, wherein the EMI shielding layer has a first portion tapering from a top surface of the conductive pad toward a top surface of the dielectric layer, and a second portion tapering away from the edge of the dielectric layer.

19. The semiconductor device package of claim 18, further comprising:

an electronic component disposed over the first surface of the substrate; and an encapsulant covering the electronic component, wherein the EMI shielding layer is disposed over the encapsulant, and the encapsulant has a slope surface defining an angle smaller than about 90 degrees with the first surface of the substrate;

a plurality of electrical contacts disposed over the first surface of the substrate; and a connector disposed over the plurality of electrical contacts and uncovered by the EMI shielding layer, wherein the EMI shielding layer has a third portion tapering from the electronic component toward the plurality of electrical contacts.

20. The semiconductor device package of claim 18, wherein the EMI shielding layer comprises a portion disposed over a sidewall of the substrate and having a top surface substantially coplanar with the dielectric layer.

* * * * *